United States Patent [19]

Opresko et al.

[11] Patent Number: 4,834,021
[45] Date of Patent: May 30, 1989

[54] APPARATUS FOR CONTROLLING THE DISTRIBUTION OF EVAPORATED MATERIAL ONTO A SURFACE

[75] Inventors: Stephen T. Opresko, Lancaster; Walter E. Root, Strasburg, both of Pa.

[73] Assignee: RCA Licensing Corporation, Princeton, N.J.

[21] Appl. No.: 132,516

[22] Filed: Dec. 14, 1987

[51] Int. Cl.$^4$ ............................................. C23C 14/00
[52] U.S. Cl. ...................................... 118/720; 118/715; 118/724; 118/726
[58] Field of Search ................ 118/715, 720, 726, 724

[56] References Cited
U.S. PATENT DOCUMENTS

| 3,904,503 | 9/1975 | Hanfmann | 118/720 |
| 4,131,753 | 12/1978 | Tsujimoto | 118/726 |
| 4,222,345 | 9/1980 | Bergfelt | 118/720 |
| 4,380,212 | 4/1983 | Kraus | 118/720 |
| 4,543,910 | 10/1985 | Dobrowolski | 118/720 |

FOREIGN PATENT DOCUMENTS

| 9574 | 1/1986 | Japan | 118/720 |
| 1079770 | 4/1986 | Japan | 118/720 |
| 1246357 | 11/1986 | Japan | 118/720 |
| 1246358 | 11/1986 | Japan | 118/720 |
| 1272369 | 12/1986 | Japan | 118/720 |
| 2103360 | 5/1987 | Japan | 118/720 |

OTHER PUBLICATIONS

Maissel et al., Handbook of Thin Film Tech., McGraw Hill, N.Y. © 1970, pp. 1-64 and 1-65.

Primary Examiner—Richard Bueker
Attorney, Agent, or Firm—E. M. Whitacre; D. H. Irlbeck; L. L. Hallacher

[57] ABSTRACT

An evaporated material distribution controller includes specially configured portions having shaped edges to maintain the ratio of the thickest and thinnest portions of the layer of material deposited onto a surface within a ratio between 1.5:1.00 and 1.00:1.00.

12 Claims, 1 Drawing Sheet

APPARATUS FOR CONTROLLING THE DISTRIBUTION OF EVAPORATED MATERIAL ONTO A SURFACE

BACKGROUND

This invention relates generally to an apparatus for controlling the distribution of evaporated material onto a surface and particularly to such an apparatus for aluminumizing the inside surface of kinescope faceplates.

An image is produced on the inside surface of a cathode-ray tube (CRT), or picture tube for a color television set, by scanning a phosphor coating on the inside surface of the tube with an electron beam. The impact of the electrons on the phosphor materials cause the phosphors to luminesce and emit the light necessary to produce the image. In order to attract electrons to the phosphor screen it is necessary to place a voltage on the screen. This is accomplished by evaporating a thin layer of conductive material, such as aluminum, over the phosphor coating on the screen. The scanning electron beams which generate the image must penetrate the aluminum layer in order to cause the phosphors to luminesce. For this reason, it is important that the thickness of the aluminum coating across the screen be fairly uniform in order to prevent variations in the light output of the tube.

Typically, in the prior art, the aluminum is distributed onto the phosphor screen by placing the screen into an evacuated chamber which includes a source of aluminum. The aluminum is provided in one or more heaters which cause the aluminum to vaporize and to coat the screen. Typically, when evaporating a layer of material on a large surface, the thickness distribution of the coating material is a function of the number of evaporation sources, the location of the sources with respect to the surface being coated, vacuum conditions within the evacuated chamber, and the size of the panel being coated. In an evaporation system where the evaporation material is replenished for each evaporation, it is desirable to have the fewest number of sources while still obtaining an acceptable distribution on the surface. A single source is not practical because experiments have shown that it is not effective for large rectangular surfaces. Four sources usually suffice if the sources are properly positioned. However, this is disadvantageous because the number of sources increases the needed maintenance, the functions to be performed by the operator and the expense of the operation. Two sources can also be used. However, typically the ratio of the thickest portion of the coated film to the thinnest portion of the film is between 4:1 and 5:1. Thickness ratios of this order are unacceptable for most CRTs, and particularly for color television picture tubes, because changes of this order in the thickness of the evaporated layer cause the light output across the tube to vary between dark and light areas. For these reasons, there is a need for an apparatus for controlling the distribution of evaporated material onto a substantially flat surface, such that the ratio between the thickest and thinnest portions of the coated layer have a ratio of less than 2:1 and preferably between 1.5:1.00 and 1.00:1.00. The present invention fulfills this need.

SUMMARY

An apparatus for controlling the distribution of an evaporated material onto a surface includes a plurality of heaters, for vaporizing the material to be coated onto the surface, spaced a preselected distance apart. An evaporated material distribution controller is arranged between the surface and the heaters, and is partially transmissive of the evaporated material for passing the evaporated material. The distribution controller includes a plurality of specially configured portions individually arranged above the heaters. The portions have shaped edges for controlling the flow paths of evaporated material from the heaters to the surface to distribute the evaporated material onto the surface with a uniformity falling within acceptable limits.

DETAILED DESCRIPTION

Figure 2:
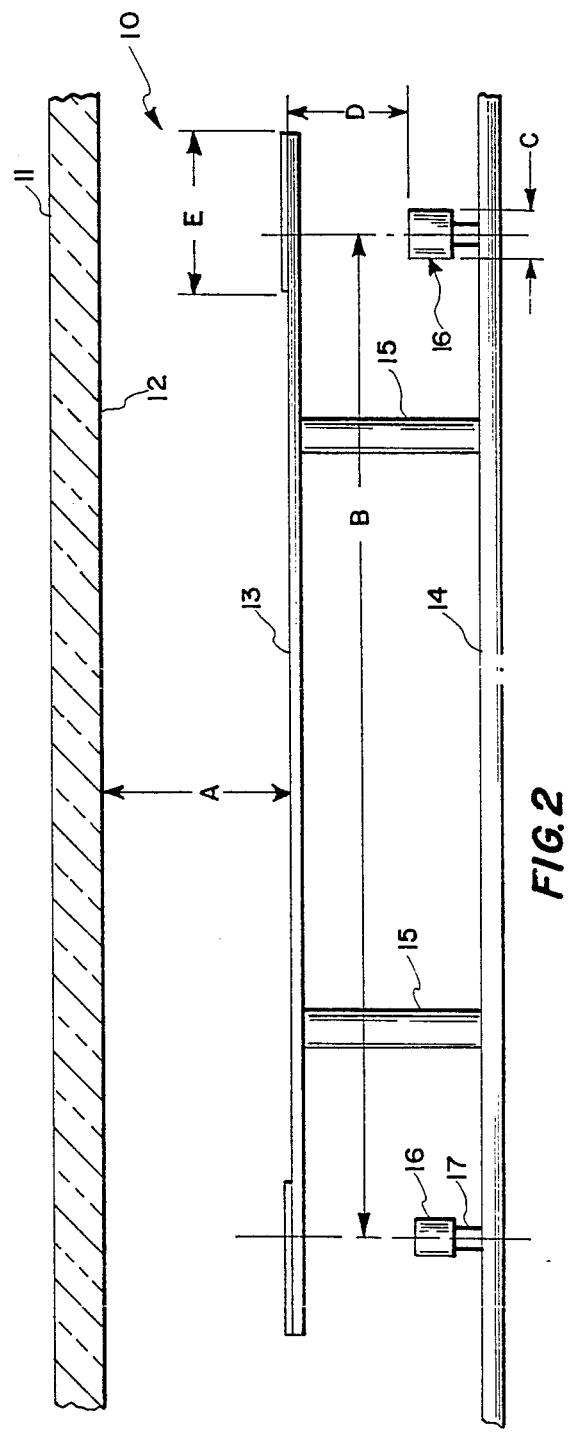
FIG. 2 is a preferred embodiment of a portion of an evaporating apparatus incorporating the distribution controller of FIG. 1.

In FIG. 2, a portion of a vacuum chamber 10 includes a panel 11 for a cathode ray tube the inside surface 12 of which is to be coated with a thin film of aluminum. For a CRT, a phosphor screen, not shown, covers the surface 12. Vacuum chambers of the type used are standard and well known in the prior art and need not be described in detail herein. An evaporated material distribution controller 13 is supported above a support plate 14 of the vacuum chamber 10 by support members 15. The heaters 16 are supported by support members 17 above the support plate 14. The heaters 16 preferably have a circular cross section having a diameter C, as shown in FIG. 2. The centers of the heaters 16 are spaced by a distance B. The height of the heaters 16 from the support plate 14 is immaterial. However, the evaporated material distribution controller 13 is arranged so that the top is spaced a distance D from the top of the heaters 16. Also, the top surface of the material distribution controller 13 is spaced a distance A from the surface 12 which is to be coated by the aluminum material.

Figure 1:
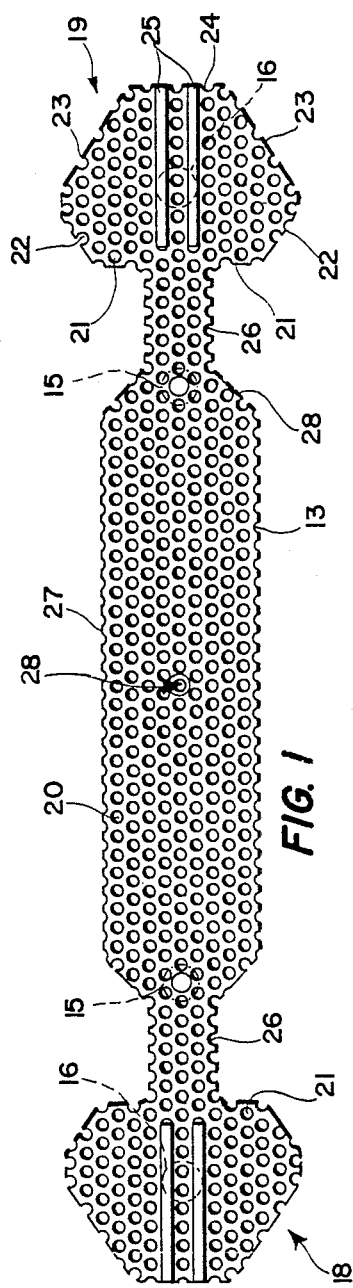
FIG. 1 is a top view of a preferred embodiment of an evaporated material distribution controller.

In FIG. 1, the distribution controller 13 includes two specially configured portions 18 and 19, which preferably are the ends of the distribution controller. The distribution controller 13 is fabricated from a rigid material and contains a very large number of perforations 20. The distribution controller 13 therefore is partially transmissive of the evaporated material which emanates from the heaters 16 of FIG. 2. The distribution controller 13 can also be fabricated from a stiff, large mesh, screen which is sufficiently rugged to withstand the heat of the evaporated material for a large number of uses. The specially configured end portions 18 and 19 support means 25 for selectively inhibiting flow of evaporated material through the distribution controller. Preferably these inhibiting means are parallel bars 25 having a length E (FIG. 2). The bars 25 thus inhibit flow through the distribution controller by blocking some of the perforations 20 in the distribution controller 13. The amount of flow which is inhibited can be selected by changing the length E of the bars and also, if desired, by changing the number of bars, or the width of the bars; that is, the material flow can be accurately controlled by varying the total area of the bars 25.

The specially configured end portions 18 and 19 both include shaped edges 21, 22, 23 and 24 which are used to control the distribution of evaporated material emanating from the heaters 16 to the surface 12 of the panel 11. A neck portion 26, having a width F, 26 connects the specially configured end portions 18 and 19 to the main body 27 of the distribution controller 13. The flow of evaporated material from the heaters 16 to the surface 12 is controlled by the end portions 18 and 19 so that the dimensions of the main body 27 of the distribution controller 13 are not important. The main body 27 therefore, serves primarily to permanently couple the end portions 18 and 19 at the critical spacing determined by the spacing of the centers of the heaters 16, and so that the controller 13 is an integral unit, for easy mounting within the evacuated chamber 10.

The heaters 16, typically, are in the form of circular cups into which pellets, or coils, of the coating material, such as aluminum, are placed. A high voltage is placed on the heaters 16 to evaporate the solid material within the cups and the evaporated material flows from the heaters 16 to the surface 12. The proper evacuation of the chamber is important, as is known to those skilled in the art. Typically, in the absence of the present invention, the portions of the surface 12 immediately above the heaters 16 receive a much heavier deposition of material than the portions of the surface 12 which are midway between the heaters 16, and also the panel portions which are outwardly toward the right and left ends of the surface 12. The specially configured portions 18 and 19 of the distribution controller 13 are effective in causing a substantial equalization of the distribution of the evaporated material to the surface 12 so that the ratio of the thickness of the coated layer at the thickest and thinnest portions of the layer have a ratio which typically is between 1.5:1.00 and 1.00:1.00. These thickness ratios are well within the acceptable variation limits of light output for a standard color television receiver.

The control of the thickness of the layer coated onto the surface 12 is effected by utilizing the shaped edges 21, 22, 23 and 24 of the end portions 18 and 19. Because the invention is intended primarily for use with panels for color television tubes, the distribution controller 13 is designed for use with all tube sizes from 19 inch (50 cm) diagonal tubes to 30 inch (79 cm) diagonal tubes. The design of the shaped end portions 18 and 19 was done utilizing computer modeling, a technique well known to those in the design art. For operation with panels for all tube sizes within the above range, the spacing B of the heaters 16 is selected to be 10 inches (25.4 cm) and the diameter C of the heaters 16 is half an inch (1.27 cm). Starting with these dimensions, which could be different for a different range of panel sizes, the following ranges of dimensions for the dimensions A, B, C, D, E and F were found by computer modeling:

$4(C) \leq A \leq 5(C)$
$4(A) \leq B \leq 6(A)$
$2(C) \leq D$
$4(C) \leq E \leq D$.
$1.5(C) \leq F$ The centers of the bars 25 are directly above the centers of the heaters 16. The shaping of the edges 21, 22 23 and 24 also is important. Initially, in shaping the end portions 18 and 19, the centers of the edges 21, 22, 23 and 24 lie on a design circle having a diameter d, which is equal to or greater than 4 times the diameter C of the heaters 16, and the center of which is coincident with the center of the heater 16. The edges 21 through 24 are then tailored by computer modeling until the center of each of the edges lies in the proximity of the circumference of the "4C" design circle and the desired evaporated material distribution to the surface 12 is obtained for all desired tube sizes. The differences in the distances of the centers of the various edges 21 through 24 from the circumference of the design circle result in the edges 21 to 24 having different lengths depending upon the tailoring needed to achieve the desired distribution on the surface 12. Preferably, the edges 21 to 24 are straight. The width F of the neck portion 26 preferably is at least 1.5C, but is not a factor in the modeling. The edge 28 of the distribution controller 13 is arbitrarily located so that the edge does not effect the thickness of the material deposited above the center of the distribution controller 13, and therefore is located substantially beyond the design circle circumference.

Utilizing the above stated relationships of the A, B, C, D, E and F dimensions, the following results are obtained, for 19 inch to 30 inch diagonal panels. An 11% change in the length E of the bars 25 results in a 4% change in the deposition thickness at the center of the panel 11. A 10% change in the diameter d of the circle containing the centers of the edges 21, 22, 23 and 24 results in a 15% change in the thickness at a distance B/2 from the center of the heaters 16. An 11% change in the location of the edge 21 results in a 13% change in the thickness of the layer directly above the center of the distribution controller 13. The bars 25 reduce the thickness of metal deposition above the heaters 16 by 33%. Typically the deposit of material on the surface 12 is thickest directly above the heaters 16 when no bars are used.

What is claimed is:

1. Apparatus for controlling the distribution of an evaporated material onto a surface comprising:
   a plurality of heaters having a diameter C spaced a preselected distance apart for vaporizing said material to be coated onto said surface;
   an evaporated material distribution controller, arranged between said surface and said heaters, said distribution controller being partially transmissive of said evaporated material for passing said evaporated material, said distribution controller also having a plurality of specially configured end portions individually arranged above said heaters, said end portions having substantially straight edges for controlling the flow paths of evaporated material from said heaters to said surface to distribute said evaporated material onto said surface with a uniformity falling within acceptable limits, the center points of said edges being in the proximity of a circle having a diameter d which exceeds the diameter C of said heaters by a minimum multiple whereby the flow of evaporated material to said surface is adjustable by selectively adjusting the proximity of said edges to said circle.

2. The apparatus of claim 1 wherein said centers of said heaters and the centers of said specially configured end portions are coincident.

3. The apparatus of claim 2 wherein said specially configured end portions each include means for selectively inhibiting flow of evaporated material through said distribution controller for selectively controlling the flow of evaporated material to the areas of said surface above said heaters.

4. The apparatus of claim 3 wherein said means for inhibiting flow includes parallel bars whereby the inhibiting of flow is adjustable by changing the total area of said bars.

5. The apparatus of claim 1 wherein said heaters are spaced between approximately four times and six times the diameter of said heaters.

6. The apparatus of claim 1 further including means for selectively inhibiting flow, and wherein said apparatus for controlling is designed in accordance with the relationships:

$4(C) \leq A \leq (C)$
$4(A) \leq B \leq 6(A)$
$2(C) \leq D$
$4(C) \leq E \geq D.$ where
- A = The spacing between said distribution controllers and said surface
- B = The spacing between said heaters
- C = The diameters of said heaters
- D = The spacing between said distribution controller and said heaters
- E = The length of said means for inhibiting.

7. The apparatus of claim 6 wherein said centers of said heaters and the centers of said specially configured end portions are coincident.

8. The apparatus of claim 7 wherein said means for inhibiting flow includes parallel bars whereby the inhibiting of flow is adjustable by changing the total area of said bars.

9. The apparatus of claim 6 wherein said heaters are spaced between approximately four times and six times the diameter of said heaters.

10. The apparatus of claim 9 wherein said edges are substantially straight.

11. In an apparatus for distributing evaporated material from a plurality of heaters to a surface, a tunable distribution controller, having a means for selectively inhibiting flow, said controller being designed in accordance with the relationships:

$4(C) \leq A \leq 5(C)$
$4(A) \leq B \leq 6(A)$
$2(C) \leq D$
$4(C) \leq E \geq D.$ where:
- A = The spacing between said distribution controller and said surface
- B = The spacing between said heaters
- C = The diameter of said heaters
- D = The spacing between said distribution controller and said heaters
- E = The length of said means for inhibiting.

12. The distribution controller of claim 11 wherein said distribution controller is partially transmissive of said evaporated material.

* * * * *